(12) United States Patent
Suga et al.

(10) Patent No.: US 9,331,305 B2
(45) Date of Patent: May 3, 2016

(54) ELECTRONIC ELEMENT SEALING METHOD AND BONDED SUBSTRATE

(71) Applicant: LAN TECHNICAL SERVICE CO., LTD., Shinjuku-ku (JP)

(72) Inventors: Tadatomo Suga, Nakano-ku (JP); Yoshiie Matsumoto, Shinjuku-ku (JP)

(73) Assignee: Lan Technical Service Co., Ltd., Shinjuku-ku (JP)

( * ) Notice: Subject to any disclaimer, the term of this patent is extended or adjusted under 35 U.S.C. 154(b) by 0 days.

(21) Appl. No.: 14/407,721

(22) PCT Filed: Jun. 14, 2013

(86) PCT No.: PCT/JP2013/066446
§ 371 (c)(1),
(2) Date: Dec. 12, 2014

(87) PCT Pub. No.: WO2013/187500
PCT Pub. Date: Dec. 19, 2013

(65) Prior Publication Data
US 2015/0171365 A1   Jun. 18, 2015

(30) Foreign Application Priority Data
Jun. 15, 2012   (JP) .................. 2012-135898

(51) Int. Cl.
*H01L 51/52* (2006.01)
*H05B 33/04* (2006.01)
*H05B 33/10* (2006.01)
*H01L 51/56* (2006.01)

(52) U.S. Cl.
CPC .......... *H01L 51/5246* (2013.01); *H01L 51/525* (2013.01); *H01L 51/56* (2013.01); *H05B 33/04* (2013.01); *H05B 33/10* (2013.01)

(58) Field of Classification Search
CPC ................ H01L 2224/97; H01L 25/50; H01L 2924/3025; H01L 2924/351; H01L 23/3157; H01L 21/50
See application file for complete search history.

(56) References Cited

U.S. PATENT DOCUMENTS

| 7,065,867 | B2* | 6/2006 | Kim .................... B81C 1/00269 174/250 |
| 7,449,773 | B2* | 11/2008 | Tarn .................... B81C 1/00269 257/686 |
| 2007/0210702 | A1 | 9/2007 | Nakamura | |

FOREIGN PATENT DOCUMENTS

| JP | 2003-323974 | 11/2003 |
| JP | 2005-347204 | 12/2005 |
| JP | 2008-10233 | 1/2008 |

OTHER PUBLICATIONS

International Search Report Issued Jul. 30, 2013 in PCT/JP13/066446 Filed Jun. 14, 2013.

*Primary Examiner* — Roy Potter
(74) *Attorney, Agent, or Firm* — Oblon, McClelland, Maier & Neustadt, L.L.P.

(57) ABSTRACT

[Problem] The aim of the invention is to provide a method of sealing an electronic element such as an organic EL element using a normal temperature bonding method that enables bonding at low temperature and in which permeation of external gases such as hydrogen or oxygen through the sealed section (dam) formed by the organic material, or the junction interface of the sealed section and a cover substrate is suppressed. [Solution] A method of sealing an electronic element comprises a step of forming a sealing section by forming a sealing section including an organic material on the surface of a first substrate formed with the electronic element, surrounding this electronic element with a thickness that is larger than that of this electronic element; a step of forming a first inorganic material layer in which a first inorganic material layer is formed at least on the exposed surface of this sealing section; and a substrate bonding step of bonding the first substrate and the second substrate by pushing together the sealing section of the first substrate and the junction location of the second substrate.

17 Claims, 9 Drawing Sheets

ELECTRONIC ELEMENT SEALING METHOD AND BONDED SUBSTRATE

TECHNICAL FIELD

The present invention relates to a sealing method for an electronic element such as an organic electroluminescence element, and a bonded substrate for an electronic element.

Organic electroluminescence elements (organic EL elements) that make use of organic electroluminescence (organic EL) are composed of planar light-emitting layers consisting of organic compounds on a transparent substrate, and they have been developed for application to thin displays and the like. Compared to liquid crystal displays, organic EL displays making use of organic EL elements have a wider viewing angle, consume less power, and are soft and flexible enough to be bent, so they have high industrial value.

However, organic EL elements have the drawback that their function can deteriorate due to the active metals used as the electrodes reacting with water or oxygen and forming insulators. Therefore, the end surfaces of the substrates are often sealed with fritted glass as a method of keeping the organic EL elements away from the outside air which contains water and oxygen. Additionally, techniques of protecting organic EL elements with thin films of organic or inorganic materials and sealing over them by a so-called dam-and-fill method are also being developed. The sealing of organic EL elements by a dam-and-fill method involves first applying a damming agent consisting of an organic material to a device substrate on which organic EL elements are formed so as to surround the organic EL elements to form a dam portion (sealing portion), then applying a filling agent consisting of an organic material over the organic EL elements to form a filling portion. In this case, the sealing function itself is maintained by the thin film.

However, since fritted seals are made by melting the fritted glass by laser irradiation, the effect of the heat on the organic EL elements is a concern. Additionally, if the substrate is a film, the frit cannot be formed by sintering on the cover substrate side. Furthermore, when a dam-and-fill method is used over a thin film seal, a high level of seal performance is required in the formed multi-layer thin film, and the production costs can become expensive. Additionally, contaminant particles can be difficult to control, causing the problem of poor yield.

Furthermore, the amount of water and oxygen that passes through the inside of the sealed portion formed by the organic material or penetrates through the bond interface between the sealing portion and the cover substrate cannot be ignored, thereby accelerating the deterioration of the organic EL elements. The most effective sealing method is to suppress the penetration of moisture at the end surfaces. While fritted glass sealing is a manifestation of such sealing of end surfaces, the need for melting by laser irradiation causes a lot of problems. A method of vacuum sealing of electronic elements that is currently being proposed involves directly contacting a newly formed surface of a material activated by irradiating with a particle beam source in a vacuum without the use of organic adhesives to perform low-temperature, low-pressure bonding (ambient temperature bonding), thereby improving the seal of the bond interface. As a result, it has become clear that various types of inorganic materials can be bonded directly at low temperatures in the absence of an adhesive or intervening layers. Therefore, ambient temperature bonding is advantageous for electronic devices comprising organic materials that cannot be processed at high temperatures because the sealing process is performed at a low temperature. However, it is difficult to directly bond organic materials by ambient temperature bonding.

SUMMARY OF THE INVENTION

In order to solve the above-described problem, the present invention has the purpose of offering a method of sealing electronic elements such as organic EL elements that suppress the penetration of air including water or oxygen through the sealing portion (dam portion) formed from the organic material or the bonding interface between the sealing portion and the cover substrate, the method for sealing electronic elements enabling bonding at relatively low temperatures.

Means for Solving the Problems

In the present invention, the substrate may be formed of a plate or film of material such as a semiconductor, glass, ceramic, metal, organic material, plastic, or a composite thereof, in various shapes such as circular or rectangular.

In the present invention, the electronic element may include but is not limited to organic EL devices. Electronic elements include, for example, electronic devices, optical devices, optoelectronic devices and MEMS (Micro-Electro-Mechanical System) devices.

In order to solve the above-described technical problems, the method for sealing an electronic element according to the present invention comprises a sealing portion forming step of forming a sealing portion containing an organic material on a surface of a first substrate on which the electronic element is formed, by surrounding the electronic element at a thickness greater than the electronic element; a first inorganic material layer forming step of forming a first inorganic material layer on at least an exposed surface of the sealing portion; and a substrate bonding step of pressing together the sealing portion on the first substrate and a bonding part of a second substrate to bond the first substrate and the second substrate. According to the present invention, electronic elements whose function may deteriorate when exposed to environmental factors such as water and oxygen can be sealed at a relatively low temperature without requiring any high-temperature processing, the penetration of outside air such as water and oxygen through the sealing portion or the bonding interface between the sealing portion and the cover substrate can be suppressed, thereby suppressing the deterioration of the electronic elements.

The method for sealing an electronic element according to the present invention may further comprise a second inorganic material layer forming step of forming a second inorganic material layer on at least the bonding part of the second substrate corresponding to the sealing portion on the first substrate; wherein the first inorganic material layer of the first substrate and the second inorganic material layer of the second substrate are bonded together. As a result, the bonding interface can be formed between predetermined inorganic materials, enabling a bonding interface of high relative strength and high sealability to be formed.

The method for sealing an electronic element according to the present invention may further comprise a filling portion forming step of forming a filling portion by covering the electronic elements on the surface of the first substrate with a filling agent, after the sealing portion forming step and before the first inorganic material layer forming step; wherein a filling portion inorganic material layer is formed during the first inorganic material layer forming step so as to cover the filling portion surface with an inorganic material, or the filling portion inorganic material layer is formed by covering the part on the second substrate corresponding to the filling portion with an inorganic material. As a result, the electronic element can be protected by the filling portion, and the bonding area between the inorganic material layers increases, thereby improving the bonding strength. Additionally, by covering the filling agent with the inorganic material layer, the release of gases from the filling agent, for example, when performing surface activation in a vacuum, can be suppressed, enabling the surface activation to be performed in an appropriate degree of vacuum.

The sealing method for an electronic element according to the present invention may further comprise a filling portion forming step of covering the electronic element on the surface of the first substrate with a filling agent, after the sealing portion forming step and after the first inorganic material layer forming step; and a step of forming a filling portion inorganic material layer by covering the filling portion surface or the part of the second substrate corresponding to the filling portion with an inorganic material. As a result, the bonding area between the inorganic material layers increases, thereby improving the bonding strength. Additionally, by forming the inorganic material layer covering the filling agent and the sealing portion in a single step, for example, the inorganic material layer can be efficiently formed. Additionally, by covering the filling agent with the inorganic material layer, the release of gases from the filling agent, for example, when performing surface activation in a vacuum, can be suppressed, enabling the surface activation to be performed in an appropriate degree of vacuum.

The sealing method for an electronic element according to the present invention may further comprise a step of forming a filling portion consisting of a filling agent on a surface portion of the second substrate corresponding to the electronic element on the surface of the first substrate; and a step of forming a filling portion inorganic material layer so as to cover the filing portion surface with an inorganic material. As a result, the step of forming the filling portion can be separated from the steps for the first substrate such as the formation of the sealing portion, enabling the steps of sealing the electronic element to be efficiently performed.

The method for sealing an electronic element according to the present invention may be one wherein the first inorganic material layer, the second inorganic material layer and the filling portion inorganic material layer are formed so as not to cover the electronic element. As a result, when the electronic element is a light-emitting device, for example, the light emitted from the light-emitting device can be efficiently released from the second substrate side.

The method for sealing an electronic element according to the present invention may be one wherein the first inorganic material layer, the second inorganic material layer and/or the filling portion inorganic material layer are formed using an inorganic material chosen from the group consisting of metals, semiconductors, nitrides, nitroxides, oxides and carbides as a main component As a result, the penetration of outside air including water and oxygen through the sealing portion can be efficiently suppressed.

The method for sealing an electronic element according to the present invention may be one wherein forming the first inorganic material layer, the second inorganic material layer and/or the filling portion inorganic material layer is preceded by forming a single layer or multiple layers consisting of an inorganic material or an organic material on an exposed surface on which the first inorganic material layer, the second inorganic material layer and/or the filling portion inorganic material layer are to be formed. As a result, the penetration of outside air including water or oxygen through the sealing portion can be more efficiently suppressed by a multi-layer film structure.

The method for sealing an electronic element according to the present invention may further comprise a surface activation step of activating at least one of the first substrate side surface and the second substrate side surface to be brought into contact in the substrate bonding step by irradiation with particles having a predetermined kinetic energy, before the substrate bonding step. As a result, the bonding strength of the bonding interface can be increased in the substrate bonding step, and penetration of outside air including water and oxygen through the bonding interface can be more efficiently suppressed.

The method for sealing an electronic element according to the present invention may be one wherein the sealing portion forming step is performed by forming a plurality of sealing portions so as to surround the electronic element in nested form. As a result, the electronic element is surrounded by multiple sealing portions, so even if one sealing portion has poor sealing performance, the other sealing portions can provide the seal, so the electronic element can be held in a state of protection from the outside air. As a result, the life span of the electronic element can be prolonged.

The method for sealing an electronic element according to the present invention may be one wherein the substrate bonding step is performed in a vacuum atmosphere or an inert gas atmosphere. As a result, the electronic element can be sealed in a vacuum atmosphere or inert gas atmosphere, enabling the life span of the electronic element to be prolonged.

The method for sealing an electronic element according to the present invention is a method for sealing an electronic element by bonding a second substrate to a first substrate having the electronic element formed on a surface, and a sealing portion containing an organic material formed so as to surround the electronic element at a greater thickness than the electronic element, the method for sealing an electronic element comprising a first inorganic material layer forming step of forming a first inorganic material layer on at least an exposed surface of the sealing portion; and a substrate bonding step of pressing together the sealing portion on the first substrate and a bonding part of the second substrate to bond the first substrate and the second substrate.

The bonded substrate sealing an electronic element according to the present invention is a bonded substrate comprising a first substrate comprising the electronic element on a surface; a sealing portion formed to surround the electronic element at a thickness greater than the electronic element on the surface of the first substrate; an inorganic material layer formed on a surface of the sealing portion; and a second substrate bonded to the first substrate with the electronic element and the sealing portion in between. According to the present invention, electronic elements whose function may deteriorate when exposed to environmental factors such as water and oxygen can be protected from the penetration of outside air such as water and oxygen through the sealing portion or the bonding interface between the sealing portion and the cover substrate, thereby suppressing deterioration of the electronic element.

The bonded substrate sealing an electronic element according to the present invention may further comprise an inorganic material layer formed on at least a bonding part of the second substrate corresponding to the sealing portion of the first substrate. As a result, it is possible to form a bonding interface between predetermined inorganic materials, and to form a bonding interface of relatively high strength and high sealability, thereby improving the sealing performance of the electronic element.

The bonded substrate sealing an electronic element according to the present invention may be one wherein the inorganic material layer is formed with an inorganic material chosen from the group consisting of metals, semiconductors, nitrides, nitroxides, oxides and carbides as a main component. As a result, the penetration of outside air including water and oxygen through the sealing portion can be efficiently suppressed.

The bonded substrate sealing an electronic element according to the present invention may further comprise a single layer or multiple layers consisting of an inorganic material or an organic material. As a result, penetration of outside air including water and oxygen through the sealing portion can be efficiently suppressed by a multilayer film structure.

The bonded substrate sealing an electronic element according to the present invention may be one wherein the sealing portion comprises a plurality of sealing portions formed so as to surround the electronic element in nested form. As a result, the electronic element is surrounded by multiple sealing portions, so even if one sealing portion has poor sealing performance, the other sealing portions can provide the seal, so the electronic element can be held in a state of protection from the outside air. As a result, the life span of the electronic element can be prolonged.

The sealing apparatus for an electronic element according to the present invention that bonds a second substrate to a first substrate having the electronic element formed on a surface, and a sealing portion consisting of an organic material formed so as to surround the electronic element at a greater thickness than the electronic element, comprises inorganic material layer forming means for forming an inorganic material layer on at least an exposed surface of the sealing portion, surface activating means for irradiating the surface of a first inorganic material layer with particles having a predetermined kinetic energy to activate the surface, and substrate bonding means for pressing the second substrate against a sealing portion on the first substrate having a surface activated by the first inorganic material layer to bond the first substrate and the second substrate.

Effects of the Invention

According to the present invention, electronic elements whose functions deteriorate upon exposure to environmental factors such as water and oxygen can be sealed at a relatively low temperature without undergoing high-temperature processing, and penetration of air including water and oxygen through the sealing portion or the bonding interface between the sealing portion and the covered substrate can be suppressed, thereby preventing deterioration of the electronic elements.

MODES FOR CARRYING OUT THE INVENTION

Herebelow, embodiments of the present invention will be explained with reference to the attached drawings.

1. First Embodiment

Figure 1:
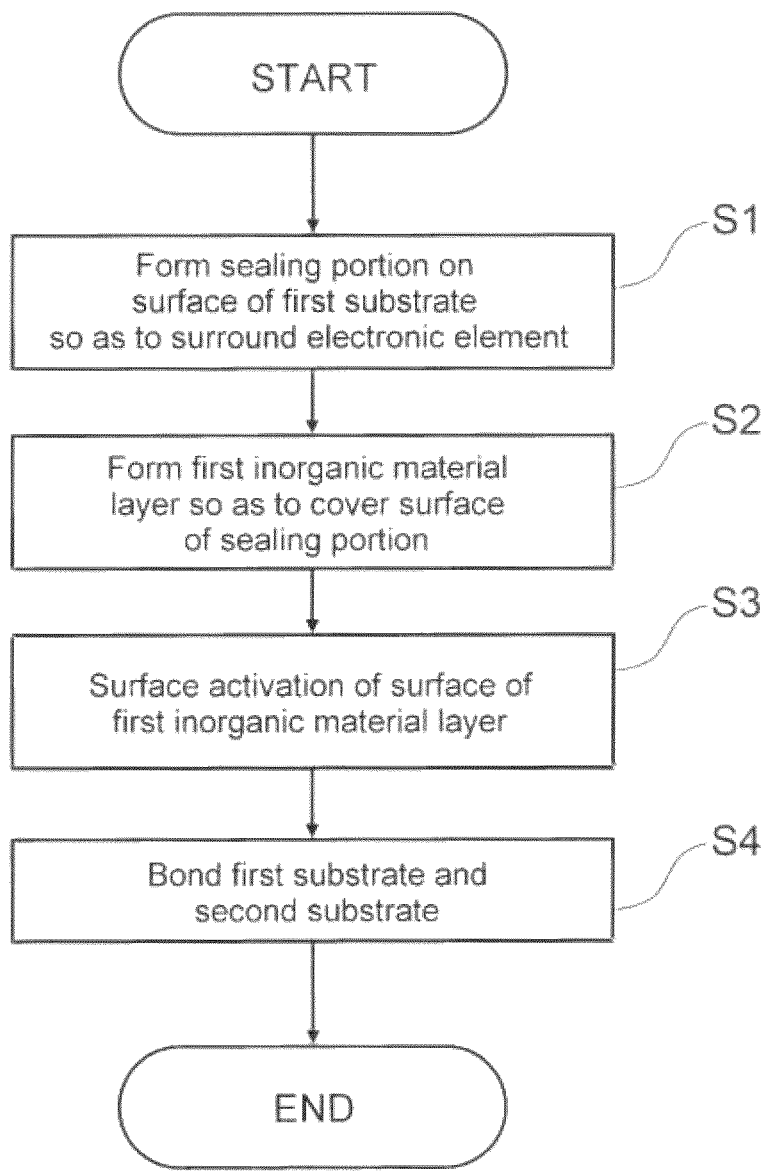
FIG. 1 A flow chart showing a method for sealing electronic elements according to a first embodiment.
Figure 2:
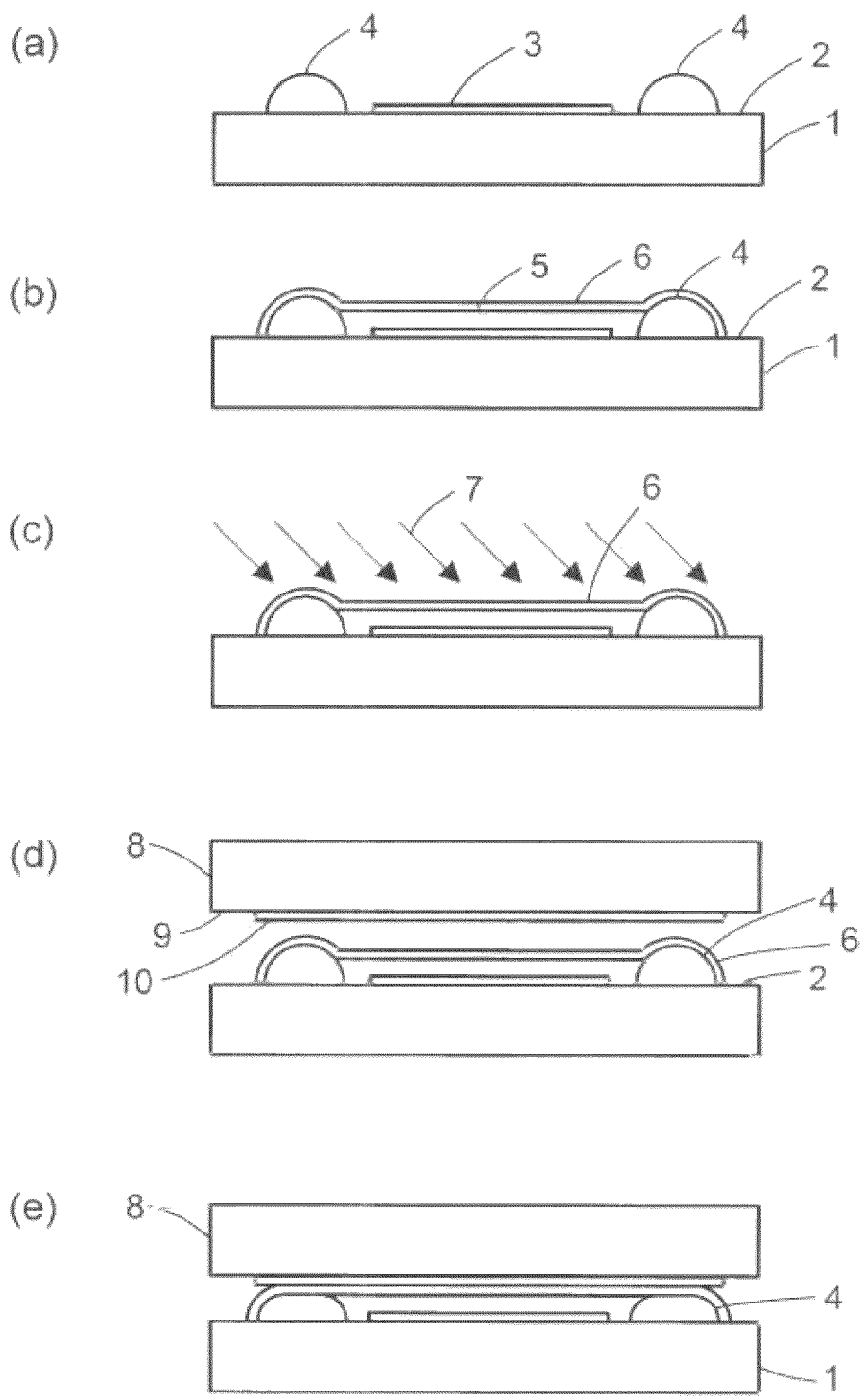
FIG. 2 A schematic section view showing the steps in a method for sealing electronic elements according to a first embodiment.

FIG. 1 is a flow chart showing a method for sealing electronic elements according to a first embodiment of the electronic elements of the present invention. FIG. 2 is a schematic section view showing the steps in the method for sealing electronic elements according to the first embodiment of the present invention.

An electronic element 3 is formed on a face (first substrate side bonding face) 2 of a device substrate (first substrate) 1 facing the second substrate during bonding. A dam (sealing portion) 4 and a filling portion for covering the electronic elements are formed on the first substrate side bonding face 2 of the first substrate 1 so as to surround this electronic element 3 (step S1, FIG. 2(a)). A first inorganic material layer 6 is formed so as to cover at least the surface of the sealing portion 4 formed in step S1 (step S2, FIG. 2(b)). The surface of the first inorganic material layer 6 formed in step S2 is irradiated with particles 7 having a predetermined kinetic energy to activate the surface (step S3, FIG. 2(c)). The surface of the first inorganic material layer 6 surface-activated in step S3 is brought into contact with the bonding face (second substrate side bonding face) 9 of the second substrate 8 (in the situation shown in FIG. 2(d), so as to contact the second inorganic material layer 10 formed on the second substrate side bonding face 9), to bond the first substrate and the second substrate via the sealing portion 4 (step S4, FIG. 2(d) and FIG. 2(e)).

1.1 Formation of Sealing Portion

In step S1, the sealing portion 4 is formed on the surface (first substrate side bonding face) 2 of the device substrate (first substrate) on which the electronic element 3 is formed. Generally, electrical wiring (not shown) extending from the electronic element 3 will be provided on the first substrate side bonding face 2 for the electronic element 3 to exchange signals with the outside. Therefore, by applying a liquid damming agent so as to pass over the electrical wiring and surround the electronic element 3, a sealing portion 4 of roughly the same height as the first substrate side bonding face 2 can be formed, irrespective of the presence or absence of electrical wiring. The device substrate (first substrate) 1 and the cover substrate (second substrate) 8 can be bonded together regardless of any irregularities on the first substrate side bonding face 2 due to electrical wiring or the like via the sealing portion 4 formed to roughly the same height over the first substrate side bonding face 2, thereby forming a sealed space consisting of the first substrate 1, the second substrate 8 and the sealing portion 4. In order to form this sealed space, the height of the first substrate side bonding face 2 of the sealing portion 4 must be greater than that of structures arranged on the bonding face of the first substrate 1 such as the electronic element 3 and the electrical wiring.

The sealing portion 4 can be formed, for example, by dispensing liquid damming agent over the first substrate side bonding face 2 while moving a dispenser for the liquid material around the electronic device 3. However, the methods for forming the sealing portion 4 are not limited thereto.

The damming agent is preferably an organic material mainly consisting of an epoxy resin, but is not limited thereto.

As a typical example, the sealing portion 4 can be formed so as to have a cross section with a width of about 1 millimeter (mm) to 2 mm, and a height above the first substrate side bonding face 2 of 50 micrometers (μm) to 100 μm. However, this cross section may be set as appropriate depending on the dimensions of the electronic element 3 and electrical wiring, the properties of the material used in the sealing portion 4, and the sealing properties.

Additionally, the sealing portion 4 is formed so as to surround the electronic element 3 on the first substrate side bonding face 2, but the surrounding shape may be appropriately chosen from among rectangles, polygons or shapes defined by curves.

Furthermore, the sealing portion 4 may be formed so as to make just one circuit of the electronic element 3 on the first substrate side bonding face 2, but a plurality of sealing portions could be formed so as to surround the electronic element in a nested fashion. As a result, even if the sealing properties of a sealing portion break down due to defects or the like, the sealing of the electronic element can be maintained by the other sealing portions. Therefore, when forming such a plurality of sealing portions with materials having similar properties, the height of the sealing portions over the first substrate side bonding face 2 should preferably be made about the same. As a result, the electronic element sealing properties of the plurality of sealing portions can be improved. When forming a plurality of sealing portions in a nested fashion, the plurality of sealing portions may be spaced apart from each other, or the sealing portions may be partially connected.

A particulate spacer could be mixed into the sealing portion in order to hold the distance between the device substrate (first substrate) and the cover substrate (second substrate) constant. As a result, when the first substrate and the second substrate are pressed together in step S4, the sealing portion can be deformed and compressed in the height direction to a constant height determined by the diameter of the spacers, thereby holding the distance between the first substrate and the second substrate at a constant value without depending on the position on the surfaces of these substrates. While the spacer particles should preferably have a diameter of from 10 μm to 50 μm, they are not limited thereto.

Substances consisting of organic materials or inorganic materials may be mixed into the sealing portion for purposes other than that of forming spacers as discussed above. For example, glass beads could be mixed into the organic material of the sealing portion. Additionally, metals such as iron or metal complexes could be mixed into the organic material.

Additionally, the sealing portion may be provided with various functions. For example, the organic material forming the sealing portion may be provided with a moisture-absorbing function.

1.2 Formation of Filling Portion

The filling portion is formed by applying a liquid filling agent so as to cover the electronic device as shown, for example, in FIG. 2(b). The liquid filling agent should preferably be an organic material mainly consisting of an epoxy resin, but is not limited thereto. Furthermore, the filling portion is not limited to being formed from a liquid filling agent. For example, the filling portion could be formed by applying sheet-shaped filling agent at predetermined positions.

1.3 Formation of Inorganic Material Layer

A first inorganic material layer 6 is formed by covering the surface of the sealing portion 4 formed in step S1 (step S2). The first inorganic material layer should preferably have low permeability, particularly to water or oxygen.

For example, the material of the first inorganic material layer may be a metal including aluminum (Al) and transition metals such as nickel (Ni), copper (Cu), iron (Fe), titanium (Ti), tantalum (Ta), chromium (Cr), gold (Au) and platinum (Pt), solder alloys including tin (Sn) and silver (Ag) or alloys thereof, semiconductors such as silicon (Si), or nitrides, nitroxides, oxides or carbides such as silicon oxide ($SiO_2$), silicon nitride ($SiN_x$), silicon oxynitride ($SiN_xO_y$), aluminum oxide ($Al_2O_3$), aluminum nitride (AlN), titanium nitride (TiN), silicon carbide (SiC) and titanium carbide (TiC).

The inorganic material layer can be formed as a multilayer film in which layers are formed from the above-described materials. When an inorganic material layer is formed as a multilayer film, an organic material layer formed, for example, of a polyacrylate may be provided at a position other than the outermost layer that is involved in bonding.

The inorganic material layer is preferably formed by a deposition method such as plasma enhanced chemical vapor deposition (PECVD) or sputter deposition, but is not limited thereto. When forming the inorganic material layer, it may be formed at only certain areas on the first substrate side bonding face by using a predetermined mask.

Additionally, when forming the inorganic material layer by depositing the predetermined inorganic material by plasma enhanced chemical vapor deposition (PECVD) or sputter deposition, inorganic materials other than the predetermined inorganic material may be mixed in. For example, when performing sputter deposition by irradiating a sputter target with a particle beam and emitting the predetermined inorganic material of the sputter target from said sputter target, a target consisting of an inorganic material other than said predetermined inorganic material may also be placed in the path of the particle beam. As a result, sputter deposition of a mixed inorganic material mixing the predetermined inorganic material with an inorganic material other than the predetermined inorganic material is possible. For example, a favorable arrangement is to use silicon (Si) as the above-described predetermined inorganic material, and to use a transition metal such as iron (Fe) as the above-described inorganic material other than the predetermined inorganic material.

The organic material layer can be formed, for example, by flash deposition of an acrylic monomer in a vacuum, followed by UV curing.

For example, when forming the filling portion 5 on the electronic element 3 as shown in FIG. 2(b), the first inorganic material layer 6 should preferably be applied to the surface of the sealing portion 4 and the surface of the filling portion 5. By applying the first inorganic material layer 6 (filling portion inorganic material layer) not only on the surface of the sealing portion 4 but also on the surface of the filling portion 5, the escape of gases into the atmosphere from the filling portion 5 during the surface activation process explained below can be blocked or suppressed by the inorganic material layer. As a result, the atmosphere can be kept clean during the surface activation process, recontamination of the surface activated bonding faces can be prevented, and a clean bonding interface can be formed. However, it is not necessary to form an inorganic material layer (filling portion inorganic material layer) on the surface of the filling portion 5.

If part of the surface of the sealing portion 4 is already covered by the filling portion 5 before forming the first inorganic material layer shown, for example, in FIG. 2(b), "forming a first inorganic material layer on at least an exposed surface of the sealing portion" does not necessarily mean that this already covered part of the surface of the sealing portion 4 also must be covered by the first inorganic material. In that case, the first inorganic material layer 6 should be applied to the surface of the sealing portion 4 so that, for example, the surface on the outside of the sealing portion 4 seen from the electronic element 3 as shown in FIG. 2(b) is covered by the first inorganic material layer even after bonding (FIG. 2(d)). As a result, the first inorganic material layer 6 can function to block or suppress water or the like passing through the sealing portion 4 after bonding.

1.4 Formation of Inorganic Material Layer on Second Substrate

A second inorganic material layer 10 can be formed in at least areas of the second substrate side bonding face 9 that bond to the sealing portion 4 (second substrate side bonding parts), using materials that can be employed in the first inorganic material layer. While the second inorganic material layer 10 does not need to be formed in areas other than the second substrate side bonding parts on the second substrate side bonding face 9, it may be formed in areas of the second substrate side bonding face 9 corresponding to the filling portion 5, as shown in FIG. 2(b) to FIG. 2(d).

1.5 Surface Activation

The surface activation of the first inorganic material layer 6 is achieved by bombarding the surface of the first inorganic material layer 6 with particles 7 having a predetermined kinetic energy to perform surface activation (step S3, FIG. 2(c)).

Bombardment with particles 7 having a predetermined kinetic energy causes the material forming the bonding faces to be physically knocked away (sputtered), thereby removing oxides and contaminants from the surface layer, and exposing a new surface of inorganic material with high surface energy, in other words, that is active.

The particles used for surface activation may, for example, be noble gases or inert gases such as neon (Ne), argon (Ar), krypton (Kr) or xenon (Xe). These noble gases do not easily chemically react with the materials forming the bonding faces to be bombarded, so they will not significantly change the chemical properties of the bonding faces such as by forming compounds.

The particles used to bombard the bonding faces to be surface activated may be provided with the predetermined kinetic energy by accelerating the particles toward the bonding faces using a particle beam source or a plasma generating device.

The particles to bombard the bonding faces to be surface activated preferably have a kinetic energy of 1 eV to 2 keV. The above-described kinetic energies are believed to result in an efficient sputtering effect on the surface layer. The desired kinetic energy value can also be set based on the above-described range of kinetic energies in accordance with the thickness of the surface layer to be removed, the properties of the materials, and the material of the new surface.

The second substrate side bonding face of the cover substrate (second substrate) on the second substrate should preferably also be surface activated. This ultimately enables the bonding strength to be improved.

Using a particle beam source, a predetermined kinetic energy can be imparted to the particles. A particle beam source may, for example, be operated in a relatively high vacuum with a pressure of $1 \times 10^{-5}$ Pa (pascals) or less. In order to draw a relatively high vacuum, material removed from the surface of the metal areas is evacuated from the atmosphere by the action of a vacuum pump. As a result, the adherence of undesirable matter to the newly exposed surface can be suppressed. Furthermore, since the particle beam source is capable of applying a relatively high acceleration voltage, a high kinetic energy can be imparted to the particles. Therefore, the surface layer can be removed and the new surface activated in an efficient manner.

As the particle beam source, it is possible to use an ion beam source that emits ion beams or a neutral atom beam source that emits a neutral atom beam.

As an ion beam source, a cold cathode type ion source may be used.

As a neutral atom beam source, a fast atom beam source (FAB) may be used. Fast atom beam sources (FAB) typically have an arrangement wherein a plasma of a gas is generated, and an electric field is applied to this plasma so as to extract positive ions of the ionized particles from the plasma and pass them through an electron cloud for neutralization. In this case, when e.g. argon (Ar) is used as the noble gas, the power supplied to the fast atom beam source (FAB) may be set to 1.5 kV (kilovolts) and 15 mA (milliamperes), or from 0.1 to 500 W (watts). For example, if a fast atom beam source (FAB) is operated at 100 W (watts) to 200 W (watts) to emit a fast atom beam of argon (Ar) for about 2 minutes, the aforementioned oxides and contaminants on the bonding face (surface layer) can be removed, to expose a new surface.

In the present invention, the particles used for surface activation may be neutral atoms or ions, they may alternatively be radicals, or they may be a group of particles mixing the above.

The surface layer removal rate may change depending on the operating conditions of the plasma or beam sources, or on the kinetic energy of the particles. Therefore, the processing time necessary for the surface activation process must be adjusted. For example, the time until the presence of oxides or carbon contained in the surface layer can no longer be observed using surface analysis techniques such as Auger electron spectroscopy (AES) or X-ray photoelectron spectroscopy (XPS) or longer may be used as the processing time for the surface activation.

The predetermined kinetic energy may be imparted to the particles using a plasma generating apparatus. By applying an alternating voltage to the bonding face of the substrate, a plasma containing particles is generated around the bonding face, and positive ions among the ionized particles in the plasma can be accelerated toward by bonding face by the above-described voltage to impart the predetermined kinetic energy. Since the plasma can be generated in a low vacuum atmosphere of about a few pascals (Pa), the vacuum system can be simplified and the evacuation step can be shortened.

Additionally, the substrate bonding (step S4) can be carried out without performing the surface activation process (step S3). For example, an inorganic material layer formed by vapor deposition in a vacuum will not have a surface that is much contaminated by oxides or impurities, and the surface energy will be high. A relatively high strength bonding interface can be formed by contacting the surfaces of such inorganic material layers together. Additionally, if the surface of the second substrate strongly bonds with the inorganic material formed on the sealing portion, there is no need to form a second inorganic material layer on the second substrate.

1.6 Substrate Bonding

After surface activation, the second substrate side bonding face 9 of the cover substrate (second substrate) 8 is arranged to face the first substrate side bonding face 2 of the device substrate (first substrate) 1 (FIG. 2(d)), and the second substrate 8 and first substrate 1 are pressed together so that a second substrate side bonding part to which the sealing portion 4 is to be bonded on the second substrate side bonding face 9 contacts the surface of the first inorganic material layer 6 through the second inorganic material layer 10, thereby bonding the first substrate 1 and the second substrate 8 (step S4, FIG. 2(e)). The bonding interface formed by contact of the surfaces of the surface activated inorganic material layers has a relatively high mechanical strength.

During the period from when surface activation is completed until bonding occurs, the atmosphere around the surface-activated first substrate and also the second substrate should preferably be held at the degree of vacuum before the surface activation, for example, $1 \times 10^{-5}$ Pa (pascals) or less. Alternatively, an inert gas such as nitrogen or argon may be introduced into the atmosphere after surface activation, and substrate bonding performed in an inert gas atmosphere.

If the surface activation process (step S3) is not to be performed, then substrate bonding may be performed after forming the inorganic material layer (step S2). When performing substrate bonding, the atmosphere should preferably be held to a vacuum of $1 \times 10^{-5}$ Pa (pascals) or less. Alternatively, an inert gas such as nitrogen or argon may be introduced into the atmosphere after surface activation, and substrate bonding performed in an inert gas atmosphere.

As a result, it is possible to prevent decreases in surface energy of the bonding faces to be bonded, such as the surfaces of the surface-activated inorganic material layer, due to adhesion of undesirable substances such as oxygen and impurities in the atmosphere. Furthermore, the bonding strength of the finally formed bonding interface can be improved.

When the first substrate and the second substrate are pressed together, the spacing between the first substrate and the second substrate should preferably be adjusted so as to be constant across the face of the substrate. When the sealing portion is formed, for example, from an organic material having elasticity such as an epoxy resin, the sealing portion will be compressed and deformed in the height direction during the process of the second substrate being pressed against the first substrate. In that case, particles (spacers) of low elasticity having a predetermined diameter or dimensions should preferably be mixed into the sealing portion. As a result, when the sealing portion is compressed in the height direction, the spacing which corresponds to the diameter of the particles in the sealing portion can be held constant across the face of the substrate. Examples of particles that may be used for such a purpose include plastics or silica with a grain size of a few μm to about 20 μm.

The damming agent forming the sealing portion can be cured with the first substrate and the second substrate being pressed together so as to have a predetermined spacing. As a result, the spacing established between the first substrate and the second substrate can be fixed, while preventing elastic deformation of the sealing portion and improving the strength at the bonding interface.

The damming agent may be cured, for example, by using a common liquid ultraviolet (UV) cured resin as the damming agent, and irradiating with ultraviolet (UV) light for a predetermined period of time for curing.

1.7 Modification Example 1

Figure 3:
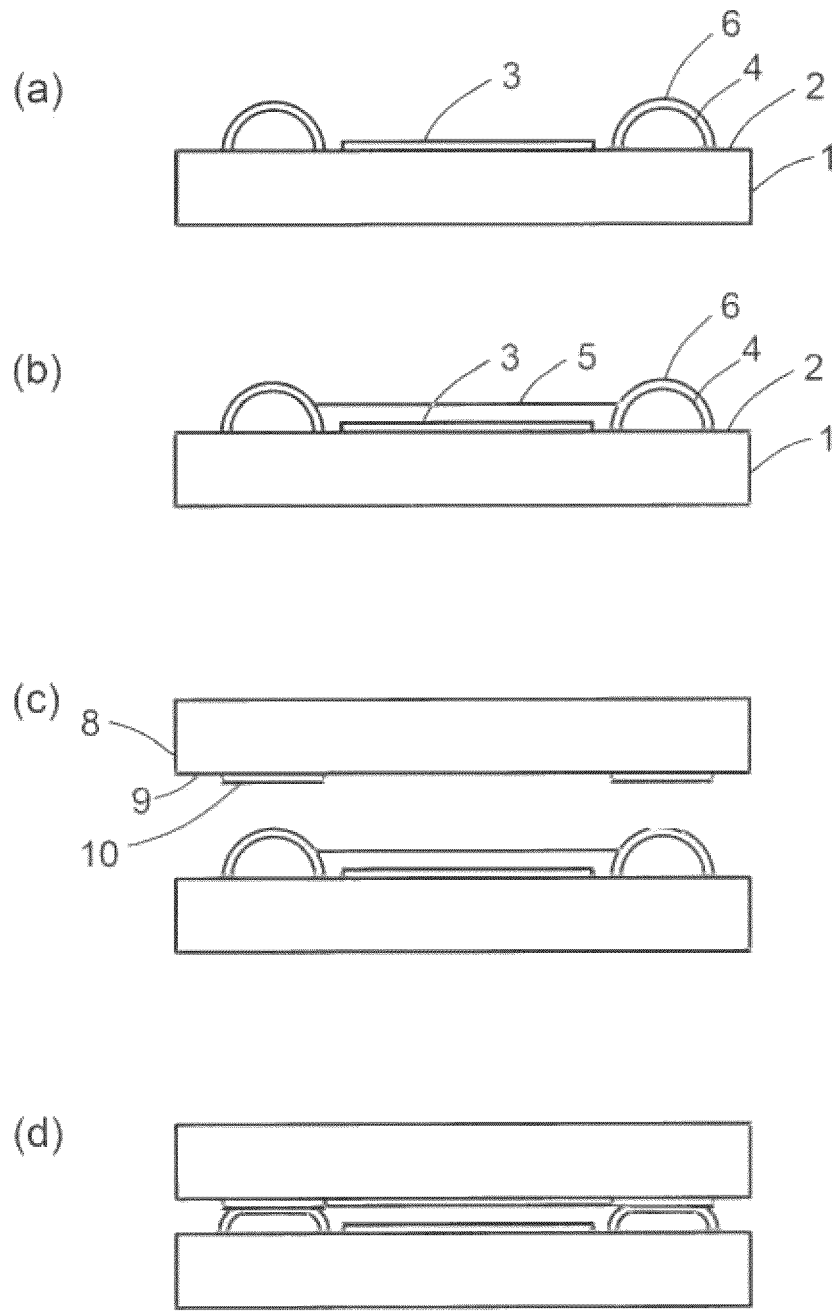
FIG. 3 A schematic section view showing a modification example of the method for sealing electronic elements.

Additionally, for example, the first inorganic material layer 6 may be formed by application onto the first substrate side bonding face 2 so as to cover at least the sealing portion 4 outside the area where the electronic element 3 is formed, as shown in FIG. 3(a). In other words, the first inorganic material layer 6 may be formed by application onto the surface of the sealing portion 4, without application over the electronic element 3, or so as not to cover the electronic element 3. In that case, application of the inorganic material layer to predetermined areas on the substrate is preferably avoided by using a predetermined mask during the step of forming the inorganic material layer. This may be followed by formation of the filling portion 5 over the electronic element 3 (FIG. 3(b)). Furthermore, it is preferable to form the electronic element 3 as a light-emitting element such as an organic EL element, to compose the second substrate 8 and the filling portion 5 of a material that is transparent to the wavelengths of electromagnetic waves or light emitted by the light-emitting element, and to arrange the second inorganic material layer 10 so as not to be formed on areas of the first substrate corresponding to the electronic element 3 (FIG. 3(c)). As a result, it is possible to produce a sealing structure for the electronic element enabling light or the like generated from the light-emitting element to be efficiently emitted through the second substrate and outside of the bonded body consisting of the first substrate and the second substrate (FIG. 3(d)). In other words, this enables a so-called top emission-type organic EL display to be produced.

1.8 Modification Example 2

Figure 4:
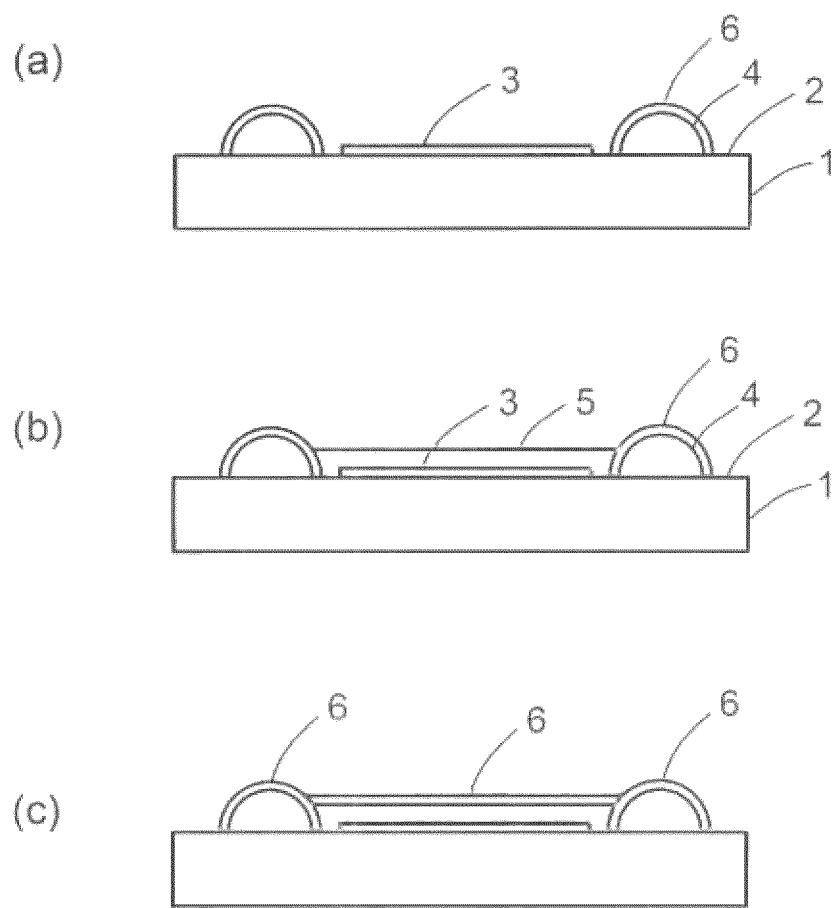
FIG. 4 A schematic section view showing a modification example of a method for forming an inorganic material layer.

As shown in FIG. 4, the first inorganic material layer 6 may be formed by forming a sealing portion 4, then applying a first inorganic material 6 so as to cover the surface of the sealing portion 4 (FIG. 4(a)), next applying a filling agent so as to cover the electronic element, thereby forming a filling portion 5 (FIG. 4(b)), and subsequently applying a first inorganic material so as to cover the filling portion 5 (FIG. 4(c)). As a result, the entire surface of the filling portion 4 can be covered by the first inorganic material layer 6, so as to form a first inorganic material layer 6 on the inside and outside faces of the sealing portion 4 as seen from the electronic element 3. In other words, water or the like passing through the sealing portion 4 can be blocked by two first inorganic material layers 6, so as to block or inhibit the penetration of water or the like into the sealing portion 4 in the sealing structure formed by bonding. That is to say, the sealing ability of the electronic element 3 can be improved. Furthermore, the bonding strength when bonding the second substrate can be improved by covering the surface of the filling portion 5 with the first inorganic material layer.

The portion of the first inorganic material layer covering the surface of the filling portion 5 (filling portion inorganic material layer) does not need to be formed.

2. Second Embodiment

Figure 5:
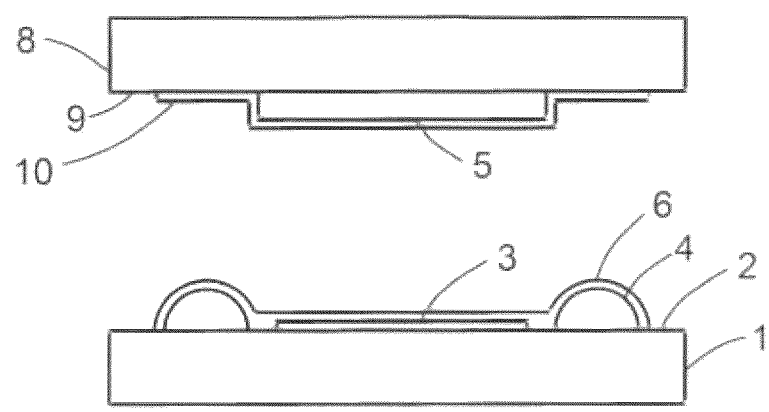
FIG. 5 A schematic section view showing a modification example of a method for sealing electronic elements.

As shown in FIG. 5, the filling portion 5 may be formed on the cover substrate (second substrate) 8 side instead of the device substrate (first substrate) 1 side. In that case, the filling portion 5 will be formed in an area on the second substrate bonding face 9 corresponding to the electronic element 3 formed on the first substrate side bonding face 2 when the first substrate 1 and the second substrate 8 are bonded. As a result, the first substrate 1 and the second substrate 8 can be bonded to cover the surface of the electronic element 3 with the filling portion 5.

Preferably, the first inorganic material layer 6 is formed on the first substrate bonding face 2 so as to cover the surface of the sealing portion 4 and the surface of the electronic element 3, and the second inorganic material 10 is formed in an area of the second substrate side bonding face 9 bonded to the sealing portion 4 on the second substrate side bonding face 9, but it is not limited thereto. Depending on predetermined properties of the final product and the conditions of the sealing step, an inorganic material layer may not be formed on the electronic element 3. Additionally, the second inorganic material 10 should preferably be formed so as to cover the surface of the filling portion 5 on the second substrate side bonding face 9 (FIG. 5). As a result, gas escaping form the filling portion 5 to the atmosphere can be blocked or suppressed by the inorganic material layer.

3. Apparatus Arrangement

Figure 6:
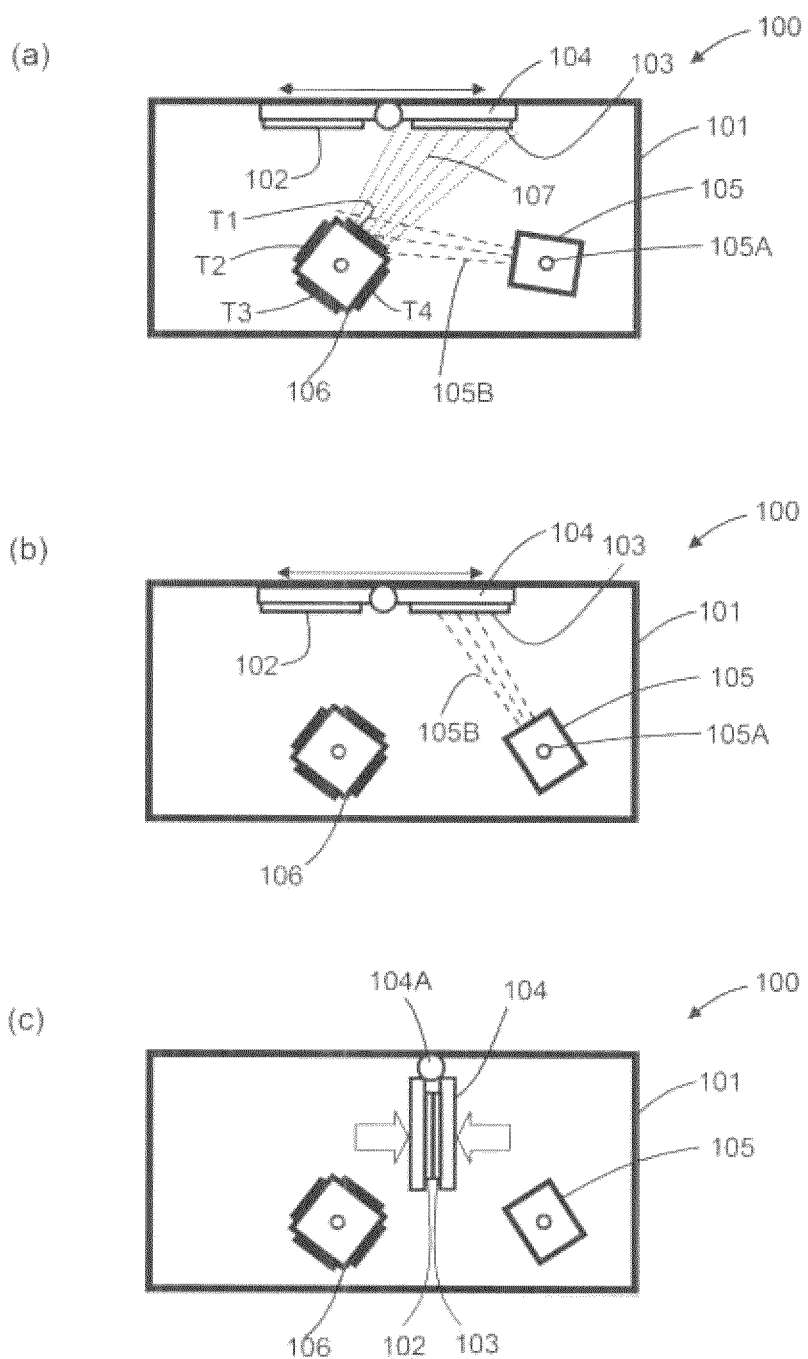
FIG. 6 A drawing schematically showing an apparatus arrangement for performing the sealing method for electronic elements according to a first embodiment.

With reference to FIG. 6, an example of an apparatus arrangement for carrying out the method of sealing an electronic element of the present invention and an electronic element sealing method using said apparatus will be explained.

The electronic element sealing apparatus 100 shown in FIG. 6(a) comprises a vacuum vessel 101, a substrate support 104 disposed inside the vacuum vessel 101 for movably supporting the first substrate 102 and the second substrate 103, a particle beam source 105 as surface activation means, and an inorganic material sputtering source 106 as inorganic material forming means for forming an inorganic material layer, the substrate support 104 having a rotating shaft 104A and pressing means (not shown) as bonding means. Due to this arrangement, a good quality inorganic material layer can be formed, and the surface activation and substrate bonding can be performed without breaking the vacuum, enabling a bonding interface of high strength to be formed.

Additionally, sealing portion means (not shown) for forming a sealing portion consisting of an organic material so as to surround the electronic element on the surface of the substrate on which the electronic element is formed can be constructed separately from the electronic element sealing apparatus 100. An example of a sealing portion means is a dispenser which is an apparatus that dispenses a predetermined amount of a liquid such as a liquid resin or a liquid substance on a predetermined path.

3.1 Inorganic Material Layer Forming Means

As shown in FIG. 6(a), the vacuum vessel 101 is connected to a vacuum pump (not shown), and the vacuum inside the vacuum vessel 101 can be maintained at a pressure of $1 \times 10^{-5}$ Pa or less. Additionally, the particle beam source 105 is capable of rotating about the rotating shaft 105A, and accelerating particles toward the inorganic material sputtering source 106, and emitting a particle beam 105B consisting of particles having a predetermined kinetic energy towards the surface of the first substrate 102 or the second substrate 103 depending on the position of the substrate support 104, to perform surface activation of the substrate surface. The inorganic material sputtering source 106 is capable of rotating about a rotating shaft 106A, and can be fixed at predetermined angles of rotation to cause one of the sputtering targets T1, T2, T3 and T4 to receive the particle beam 105B from the particle beam source 105 and eject the inorganic material set in sputtering target T1 to T4 to one of the first substrate 102 or the second substrate 103. As a result, the predetermined first inorganic material and second inorganic material are deposited respectively on the first substrate side bonding face and the second substrate side bonding face to form the first inorganic material layer and the second inorganic material layer. When depositing inorganic materials in only predetermined areas on the substrate, a mask defining said predetermined areas is positioned over the substrate (not shown).

Additionally, when depositing the inorganic material, the substrate support 104 may be scanned to make the deposition conditions on the first substrate 102 and the second substrate 103 uniform. The thickness of the inorganic material layer may be controlled in stages depending on the operating conditions of the predetermined particle beam source 105 and the predetermined arrangement positions inside the vacuum vessel 101 of the particle beam source 105, the inorganic material sputtering source 106, and the substrates 102, 103.

The material set in the sputtering target may be a metal including aluminum (Al) and transition metals such as nickel (Ni), copper (Cu), iron (Fe), titanium (Ti), tantalum (Ta), chromium (Cr), gold (Au) and platinum (Pt), solder alloys including tin (Sn) and silver (Ag) or alloys thereof, semiconductors such as silicon (Si), or nitrides, nitroxides, oxides or carbides such as silicon oxide ($SiO_2$), silicon nitride ($SiN_x$), silicon oxynitride ($SiN_xO_y$), aluminum oxide ($Al_2O_3$), aluminum nitride (AlN), titanium nitride (TiN), silicon carbide (SiC) and titanium carbide (TiC). Additionally, when forming the organic material layer, a sputtering target in which the organic material is set may be prepared.

Additionally, in the apparatus shown in FIG. 6, the number N of sputtering targets is 4, but there is no such limitation. For example, the number N of sputtering targets may be changed by making the cross-sectional shape of the inorganic material sputtering source 106 perpendicular to the rotating shaft 106A an N-shaped polygon, and changing the number N.

In order to form the inorganic material layer as a multilayer film, each layer should be formed by rotating the inorganic material sputtering source 106 and orienting a predetermined sputtering target on which the material of the layer to be formed is set in the direction of emission of the particle beam 105B.

3.2 Surface Activation Means

The surface activation process, as shown in FIG. 6(b), is performed by rotating the particle beam source 105 about the rotating shaft 105A and stopping it at a position facing the first substrate 102 or the second substrate 103, and emitting a particle beam 105B of particles having a predetermined kinetic energy with respect to the first substrate 102 and the second substrate 103. When performing surface activation of only predetermined areas on the substrate, a mask defining said predetermined areas is arranged over the substrate (not shown).

Figure 7:
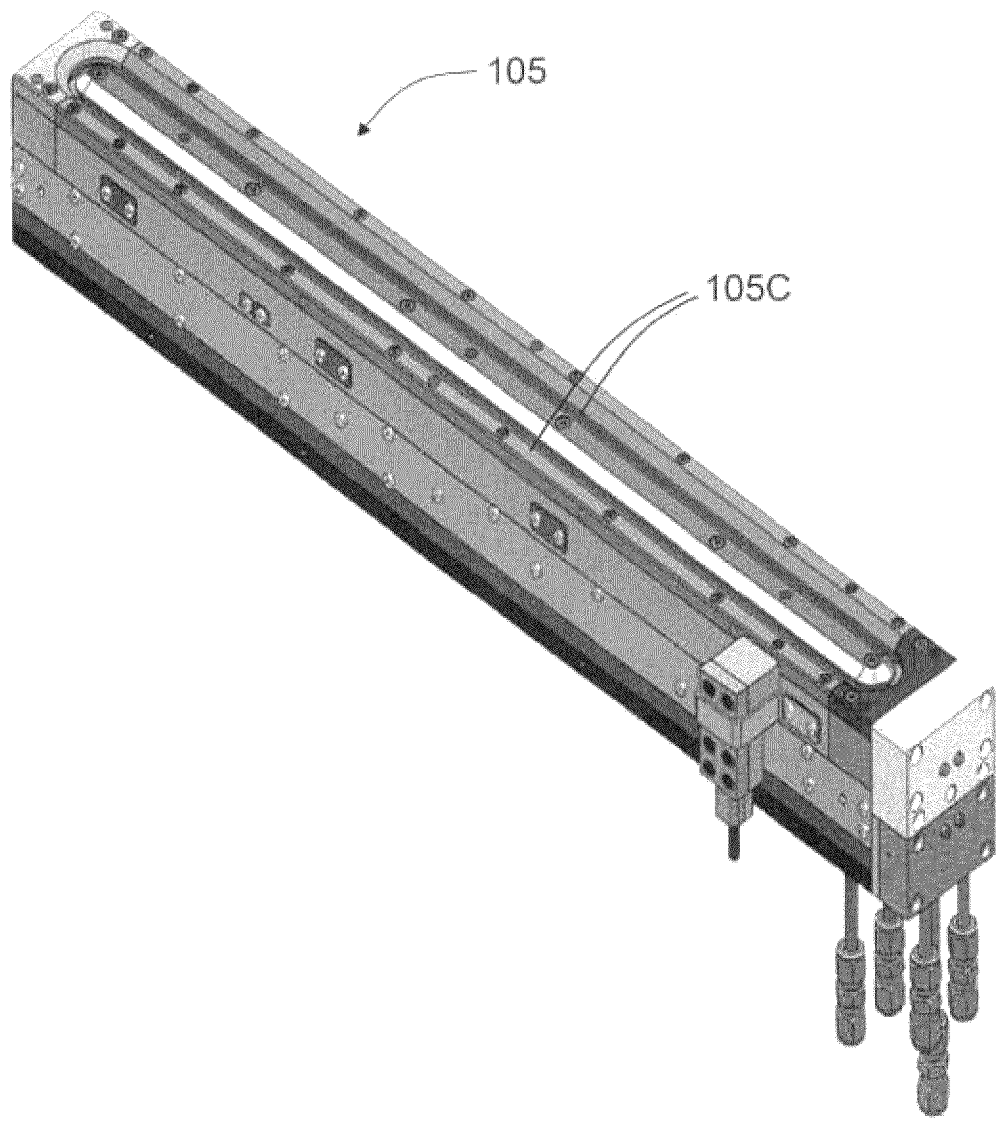
FIG. 7 A perspective view of a linear particle beam source.

The example of the particle beam source 105 shown in FIG. 7 is a linear particle beam source (FIG. 7), more specifically a linear cold-cathode type ion beam source. The linear particle beam source is a particle beam source 105 comprising a linear (line-shaped) or elongated particle beam emission port 105C, capable of emitting a linear (line-shaped) particle beam from this emission port. The length of the emission port 105C is preferably greater than the diameter of the substrate to be irradiated by the particle beam. If the substrate is not circular, the length of the emission port 105C should preferably be greater than the maximum size in the direction of extension of the emission port 105C of the substrate which can be moved relative to the particle beam source.

The particle beam 105B emitted from the linear particle beam source 105 irradiates a line-shaped area on the substrate extending in the direction perpendicular to the surface of the paper in FIG. 6, at a certain time during the surface activation process. While emitting a particle beam 105B from the linear particle beam source 105 toward the substrate 102 or 103, the substrate support 104 is scanned in the direction of extension of the emission port and the direction perpendicular thereto (lateral direction in FIG. 6). As a result, the irradiation area of the line-shaped particle beam passes across all bonded portions of the substrate. When the linear particle beam source has finished passing over the substrate, the entire substrate has been evenly irradiated by the particle beam 105B and surface activated.

The linear particle beam source is suited to irradiation of the surface of a substrate of relative large area with a relatively uniform particle beam. Additionally, the linear particle beam source can be used to irradiate substrates of various shapes with a relatively uniform particle beam.

When forming a multilayer film, the adhesive strength between layers can be increased by performing appropriate surface activation processes on the surfaces of the formed layers after formation of the respective layers.

Additionally, when forming the inorganic material layer using a non-metallic material as the main component, a predetermined amount of metal should preferably be mixed into the inorganic material layer. As a result, the bonding strength can be improved. For example, when forming the inorganic material layer using silicon (Si) as the main component, a transition metal such as iron or nickel should preferably be mixed so as to be present in a proportion of less than one atomic layer on the surface of the inorganic material layer. In that case, elements consisting of the metal to be mixed are placed inside or near the particle beam source 105 at positions where some of the accelerated particle beam 105B will collide. As a result, predetermined metals such as iron or nickel can be mixed into the particle beam 105B by activating the particle beam 105B from the particle beam source 105 after forming the inorganic material layer from a predetermined non-metallic material such as silicon (Si). The amount of metal mixed is controlled by the operating conditions of the particle beam source 105, the arrangement of the element consisting of the metal to be mixed, and the arrangement of elements inside the vacuum vessel 101.

3.3 Bonding Means

As shown in FIG. 6(c), the substrate support 104 has bonding means comprising a rotating shaft 104A provided between the portions where the first substrate 102 and the second substrate 103 are supported. The substrate support 104 is arranged to be capable of being folded so that the first substrate 102 and the second substrate 103 can face each other about the rotating shaft 104A. As a result, as shown in FIG. 6(c), a simple arrangement can be used to bring the first substrate 102 and the second substrate 103 into contact and apply roughly the same pressure uniformly across the entire area.

Pressing means (not shown) may be arranged for applying a predetermined force from outside the folded substrate support 104 so as to press together the first substrate 102 and the second substrate 103 during bonding. Additionally, heating means (not shown) may be arranged for heating the first substrate 102 and the second substrate 103 to a predetermined temperature within a range not reducing the function of the electronic element during bonding.

Additionally, ultraviolet irradiation means (not shown) may be provided for irradiating the sealing portion with ultraviolet rays (UV) while the first substrate 102 and the second substrate 103 are pressed together.

The apparatus arrangement shown in FIG. 6 is one example of an apparatus arrangement for performing the method of sealing the electronic element of the present invention, but the structure is not limited thereto.

While FIG. 6 schematically shows an apparatus arranged to perform the surface activation process and the substrate bonding process in the same vacuum vessel, the arrangement need not be so limited. For example, the apparatus arrangement may have the vacuum vessel for performing the surface activation process and the vacuum vessel or chamber for performing the substrate bonding process provided separately (not shown).

While FIG. 6 schematically shows an apparatus wherein the first substrate and the second substrate are bonded by folding the substrate support 104 about the rotating shaft 104A, the arrangement need not be so limited. For example, it is possible to provide a pair of substrate supports capable of supporting the first substrate and the second substrate so that the bonding surfaces are roughly parallel and face each other, then bringing one of the substrates near the other substrate, or further applying pressure thereto. In this case, the apparatus may be arranged so that the pair of substrate supports is operated by a robot and the approaching movement of the substrate support is controlled by a servo motor or the like. Additionally, the apparatus may be arranged to apply the pressure from the back sides of the substrates on both sides, or to immobilize just one of the substrates and apply pressure from only the back side of the other substrate (not shown).

The bonding means may also be provided with a positioning mechanism for positioning in the X-Y direction parallel to the bonding faces when bonding the first substrate and the second substrate, and positioning between the substrates such as positioning of the angle of rotation about the normal to the bonding faces. This positioning may be performed by observing markings on the substrates or markings on the substrate support with a CCD camera or the like, and adjusting the markings between the substrates within a predetermined precision (not shown).

EXAMPLES

Herebelow, the present invention will be explained in detail by reference to examples, but the present invention is not to be construed as being limited by these examples.

As an example of the first embodiment, the cases for bonding when using aluminum (Al), copper (Cu) or silicon (Si) as the inorganic material layer will be respectively explained.

In these examples, a pair of PET films of thickness 125 micrometers (μm) and about 7 cm on a side were used as the first substrate and second substrate.

Example 1

First, we will explain the case in which aluminum (Al) or silicon (Si) is used as the inorganic material layer. The formation of the inorganic material layer by aluminum (Al) and formation of the inorganic material layer by silicon (Si) were performed with the same operating conditions for the linear particle beam source. Argon (Ar) particles generated by a plasma and accelerated by a potential difference of 1.2 kV from a linear particle beam source were directed towards an aluminum (Al) or silicon (Si) sputter target. The linear particle beam source (cold cathode type ion beam source) was driven under conditions of 1.2 kV and 400 mA while supplying 93 sccm of argon (Ar). Most of the accelerated argon ions were neutralized by a neutralizer while maintaining almost all the kinetic energy. The sputtering effect due to collisions of the argon atom beam emitted from the particle beam source caused atoms or clusters of aluminum (Al) or silicon (Si) to be emitted from the sputter target in the direction of the inorganic material layer. The linear particle beam source and linear sputter target, as a unit, were scanned a total of three times across the substrate at a relative speed of 1200 mm/min. Under the above conditions, a layer of aluminum (Al) or silicon (Si) of about 10 nm was formed on the substrate.

Next, the surfaces of the formed aluminum (Al) or silicon (Si) layers were surface-activated without breaking the vacuum. The surface activation treatment used the same linear particle beam source as that used to form the inorganic material layer. The linear particle beam source was driven under conditions of 1.0 kV and 100 mA while supplying 70 sccm of argon (Ar) to irradiate the substrate with an argon particle beam, then scanned once across the substrate at a relative speed of 1200 mm/min.

Example 2

Next, the case in which copper is used for the inorganic material layer will be explained. From the linear particle beam source, argon (Ar) particles generated by a plasma and accelerated with a potential difference of 1.2 kV were directed towards a copper (Cu) sputter target. The linear particle beam source was driven under conditions of 1.2 kV and 400 mA while supplying 93 sccm of argon (Ar). Most of the accelerated argon ions were neutralized by a neutralizer while maintaining almost all the kinetic energy. The sputtering effect due to collisions of the argon atom beam emitted from the particle beam source caused atoms or clusters of copper (Cu) to be emitted from the sputter target in the direction of the substrate. The linear particle beam source and linear sputter target, as a unit, were scanned a total of six times across the substrate at a relative speed of 1200 mm/min. Under the above conditions, a layer of copper of about 10 nm was formed on the substrate.

Next, the surface of the formed copper layer was surface-activated without breaking the vacuum. The surface activation treatment used the same linear particle beam source as that used to form the inorganic material layer. The linear particle beam source was driven under conditions of 1.0 kV and 100 mA while supplying 70 sccm of argon (Ar) to irradiate the substrate with an argon particle beam, then scanned a total of 2 times across the substrate at a relative speed of 1200 mm/min.

Two inorganic material layers formed from the same material, aluminum, copper or silicon, surface-activated under the above-indicated conditions, were brought into contact with each other, to bond the substrates together at standard temperature. At this time, a pressure of about 5 MPa was applied for 3 minutes using a circular jig having approximately flat surfaces with a diameter of about 50 mm.

Example 3

In Example 3, PEN was used as the substrate, and an inorganic layer was formed by stacking a silicon layer and an aluminum layer. In the present example, the conditions for formation of the inorganic material layer and the conditions for surface activation were different from Example 1, while the other conditions were the same. Herebelow, the conditions for formation of the inorganic material layer and the conditions for surface activation will be explained.

First, in order to form a layer of silicon on the substrate, the linear particle beam source was used to direct argon (Ar) particles generated by a plasma and accelerated with a potential difference of 1.2 kV towards a silicon (Si) sputter target. The linear particle beam source was driven under conditions of 1.2 kV and 400 mA while supplying 93 sccm of argon (Ar). Most of the accelerated argon ions were neutralized by a neutralizer while maintaining almost all the kinetic energy. The sputtering effect due to collisions of the argon atom beam emitted from the particle beam source caused atoms or clusters of silicon (Si) to be emitted from the sputter target in the direction of the substrate. The linear particle beam source and linear sputter target, as a unit, were scanned once across the substrate at a relative speed of 1200 mm/min.

Next, the sputter target was changed from silicon (Si) to aluminum (Al), and under the same conditions, a layer of aluminum (Al) was deposited on the layer of silicon (Si). As a result, an inorganic material layer of about 5 nanometers was formed.

Next, the surface of the formed aluminum (Al) layer was surface-activated without breaking the vacuum. The surface activation treatment used the same linear particle beam source as that used to form the inorganic material layer. The linear particle beam source was driven under conditions of 1.0 kV and 100 mA while supplying 70 sccm of argon (Ar) to irradiate the substrate with an argon particle beam, then scanned once across the substrate at a relative speed of 1200 mm/min.

Additionally, an experiment was performed using the same conditions, but switching the sequence of the layers on material in the inorganic material layer, first forming a layer of aluminum (Al) on the substrate, then forming a layer of silicon (Si) thereon, and similar results were obtained (not shown).

Example 4

Herebelow, experiments that were carried out to evaluate the performance of the sealing structure according to the present example will be explained.

Preparation of Sealing Structure in Present Example

First, the method of preparation of a sealing structure according to the present example will be explained. A cover substrate was formed by a glass material 45 mm on a side, a substrate for forming electronic elements was formed by a glass material 50 mm on a side, and an organic EL element was used as the electronic element. A dam portion was formed on the electronic element substrate by spin coating or a photo process such as photolithography using a novolac resin. In the present example, a novolac resin was used for the dam portion, but a dam portion of similar shape can be formed using a PI (polyimide), and similar effects can be obtained. The height of the dam portion was 1 to and the width of the dam portion was about 2 mm.

Then, a sheet was applied so as to cover the organic EL element. The function of this sheet was to avoid damaging the organic EL element due to flexing of the central portion because the bonding occurs in a vacuum. This sheet did not have the function of a desiccant. Next, in order to thermally cure the sheet, it was heated for 2 hours under curing conditions of 100° C.

Subsequently, an SiN thin film with a thickness of about 30 nm was formed so as to cover both the dam portion of the cover substrate (cover glass) and the portion of the electronic element substrate corresponding to the dam portion. By covering the substrate surface with an insulating film in this way, the passage of electricity over the substrate can be prevented. In order to form the above-mentioned SiN thin film, with the background pressure at less than $1.0\times10^{-5}$ Pa, argon (Ar) particles plasmized and accelerated with a potential difference of 1.5 kV by a linear particle beam source were directed towards a sputter target of silicon nitride (SiN). The linear particle beam source was driven under conditions of 1.5 kV and 400 mA while supplying 80 sccm of argon (Ar). Most of the accelerated argon ions were electrically neutralized by a neutralizer while maintaining almost all the kinetic energy. The sputtering effect due to collisions of the argon particles emitted from the particle beam source caused clusters of silicon nitride (SiN) to be emitted from the sputter target in the direction of predetermined locations on the substrate. The linear particle beam source and linear sputter target, as a unit, were scanned 20 times across the substrate at a relative speed of 1200 mm/min. As a result, an SiN thin film with a thickness of about 30 nm was formed on the dam portion of the cover substrate and locations on the electronic element substrate corresponding to the dam portion.

Then, an Si thin film with a thickness of about 20 nm was formed so as to cover both the dam portion on the cover substrate (cover glass) and the electronic element substrate corresponding to the dam portion. This Si thin film has the function of a thin film for bonding. In order to form the Si thin film, with the background pressure at less than $1.0\times10^{-5}$ Pa, argon (Ar) particles plasmized and accelerated with a potential difference of 1.2 kV by a linear particle beam source were directed towards a sputter target of silicon (Si). The linear particle beam source was driven under conditions of 1.2 kV and 400 mA while supplying 80 sccm of argon (Ar). Most of the accelerated argon ions were electrically neutralized by a neutralizer while maintaining almost all the kinetic energy. The sputtering effect due to collisions of the argon particles emitted from the particle beam source caused atoms or clusters of silicon (Si) to be emitted from the sputter target in the direction of predetermined locations on the substrate. The linear particle beam source and linear sputter target, as a unit, were scanned 5 times across the substrate at a relative speed of 1200 mm/min. As a result, a Si thin film with a thickness of about 20 nm was formed on the dam portion of the cover substrate and locations on the electronic element substrate corresponding to the dam portion.

Next, the surface of the formed Si thin film was surface activated without breaking the vacuum. This surface activation was performed using the same linear particle beam source as that used to form the inorganic material layer. The linear particle beam source was driven under conditions of 1.0 kV and 100 mA while supplying 70 sccm of argon (Ar), to emit an argon particle beam toward the substrate, which was scanned across the substrate once at a relative speed of 1200 mm/min.

Thereafter, the surfaces of the Si thin films of both surface-activated substrates were pressed together for 5 minutes with a force of 5.0 kN, without breaking the vacuum. As a result, a sealing structure was formed.

<Environmental Test>

Figure 8A:
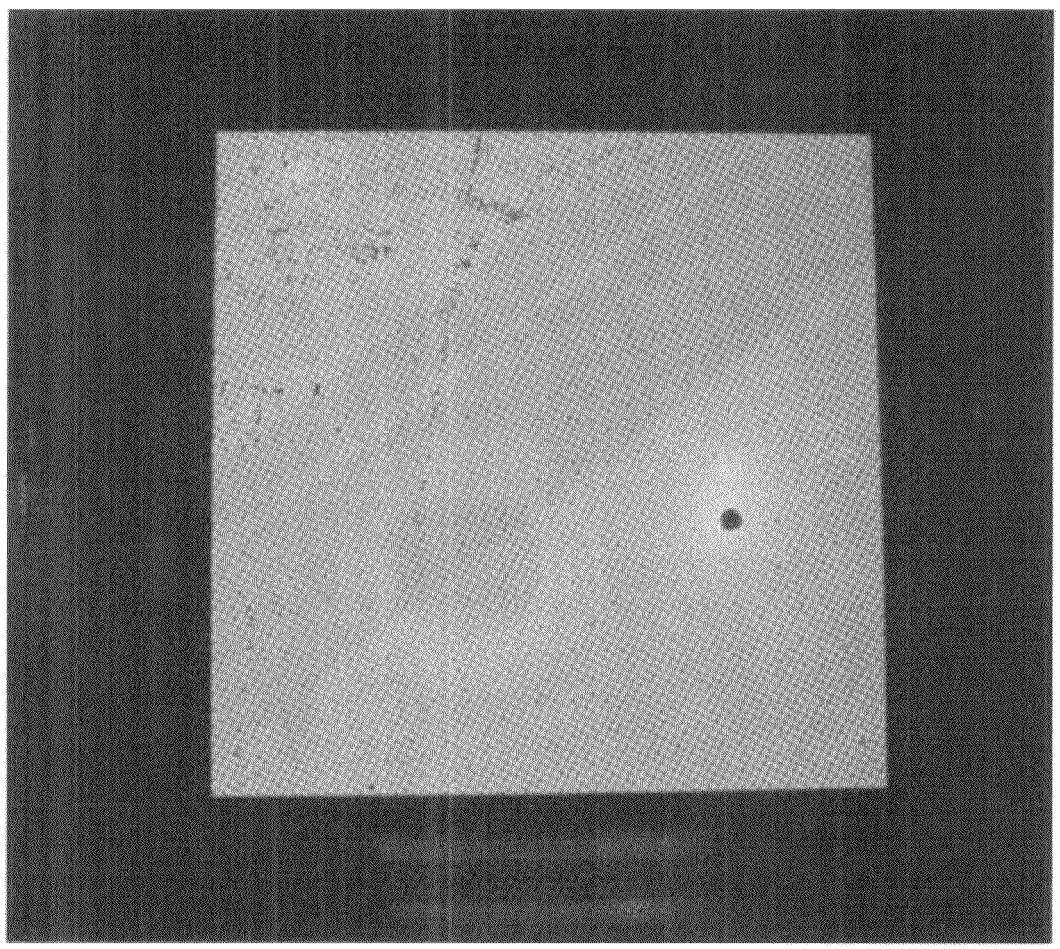
FIG. 8a A photograph of an organic EL element sealed by a sealing method according to an embodiment of the present invention, at the start of environmental testing.
Figure 8B:
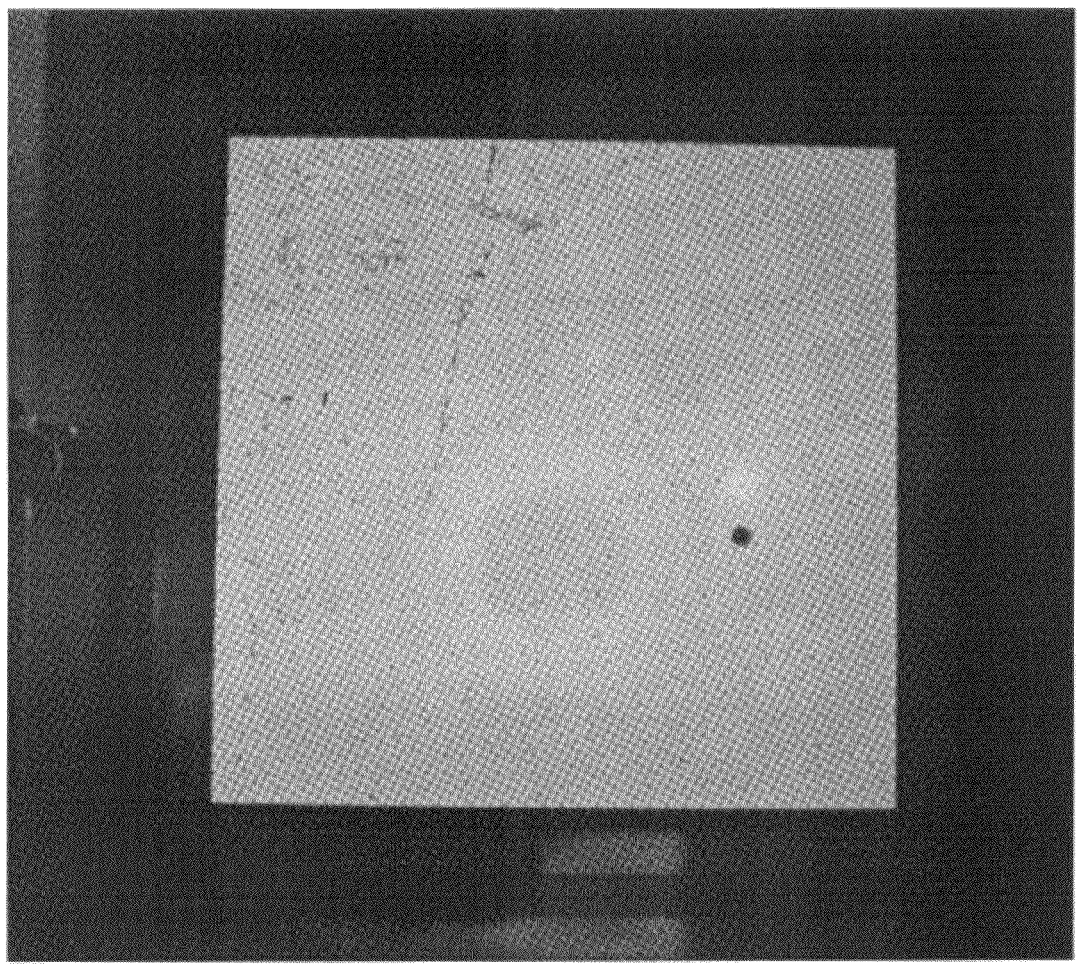
FIG. 8b A photograph of an organic EL element sealed by a sealing method according to an embodiment of the present invention, during environmental testing.

Next, the sealing structure A according to the present example was subjected to an endurance test using an environmental tester under conditions of temperature 85 degrees Celsius and humidity 85%, without lighting the organic EL element. FIG. 8(a) is a photograph showing light emission at the start of the endurance test. On the other hand, FIG. 8(b) is a photograph showing light emission after passage of about 140 hours from the start of the endurance test. There were no changes in light emission defects which were observed from the beginning in several locations, and the appearance of defects in the light emitting portions was also not observed. Upon passage of 300 hours, dark spots which were originally present inside or due to some moisture penetration began to develop.

Thus, even under conditions of 85° C./85% RH, no changes in light emission properties or growth or increase of defects were observed after the passage of 140 hours. In other words, the present test was also able to confirm that the present invention is capable of greatly increasing the sealing performance. The endurance time in the environmental test can be expected to be further extendable with reevaluation of the process, and improvements against factors causing water penetration during the organic EL deposition step.

As mentioned above, with the present invention, PI and novolac resins can be used as a dam portion, and a sealing structure exhibiting high sealing performance even in environmental tests can be offered.

While several embodiments and examples of the present invention have been explained above, these embodiments and examples are merely presented to exemplify the present invention. The claims cover many modifications to the embodiments within a range not departing from the technical concept of the present invention. Therefore, the embodiments and examples disclosed in the present specification are presented for exemplary purposes only, and should not be construed as limiting the scope of the present invention.

DESCRIPTION OF REFERENCE NUMBERS 1 first substrate
2 first substrate side bonding face
3 electronic element
4 sealing portion
5 filling portion
6 first inorganic material layer
7 particles having predetermined kinetic energy
8 second substrate
9 second substrate side bonding face
10 second inorganic material layer
100 electronic element sealing device
101 vacuum vessel
102 first substrate
103 second substrate
104 substrate support
104A rotating shaft of substrate support
105 particle beam source
105A rotating shaft of particle beam source
105B particle beam
105C emission port
106 inorganic material sputter source
106A rotating shaft of inorganic material sputter source
T1-T4 targets

The invention claimed is:
1. A method for sealing an electronic element, the method comprising:
(i) forming a sealing portion comprising an organic material on a surface of a first substrate on which the elec- tronic element is formed, by surrounding the electronic element at a thickness greater than the electronic element;

(ii) forming a first inorganic material layer on at least an exposed surface of the sealing portion; and (iii) pressing together the sealing portion on the first substrate and a bonding part of a second substrate to bond the first substrate and the second substrate.

2. The method according to claim 1, further comprising:

(iv) forming step of forming a second inorganic material layer on at least the bonding part of the second substrate corresponding to the sealing portion on the first substrate;

wherein the first inorganic material layer of the first substrate and the second inorganic material layer of the second substrate are bonded together.

3. The method according to claim 1, further comprising:

(v) forming a filling portion by covering the electronic elements on the surface of the first substrate with a filling agent, after said forming (i) and before said forming (ii);

wherein a filling portion inorganic material layer is formed during said forming (ii) so as to cover the filling portion surface with an inorganic material, or the filling portion inorganic material layer is formed by covering a part on the second substrate corresponding to the filling portion with an inorganic material.

4. The method according to claim 1, further comprising:

(vi) covering the electronic element on the surface of the first substrate with a filling agent, after said forming (i) and after said forming (ii); and (vii) forming a filling portion inorganic material layer by covering the filling portion surface or a part of the second substrate corresponding to the filling portion with an inorganic material.

5. The method according to claim 1, further comprising:

(viii) forming a filling portion consisting of a filling agent on a surface portion of the second substrate corresponding to the electronic element on the surface of the first substrate; and (ix) forming a filling portion inorganic material layer so as to cover the filing portion surface with an inorganic material.

6. The method according to claim 2, wherein the first inorganic material layer, the second inorganic material layer, and a filling portion inorganic material layer are formed so as not to cover the electronic element.

7. The method according to claim 3, wherein the first inorganic material layer, the second inorganic material layer and/or the filling portion inorganic material layer are formed using an inorganic material selected from the group consisting of a metal, a semiconductor, a nitride, nitroxides, an oxide, and a carbide as a main component.

8. The method according to claim 3, wherein forming the first inorganic material layer, the second inorganic material layer and/or the filling portion inorganic material layer is preceded by forming a single layer or multiple layers consisting of an inorganic material or an organic material on an exposed surface on which the first inorganic material layer, the second inorganic material layer and/or the filling portion inorganic material layer are to be formed.

9. The method according to claim 1, further comprising (x) before said pressing (iii), activating at least one of the first substrate side surface and the second substrate side surface to be brought into contact in said pressing (iii) by irradiation with particles having a predetermined kinetic energy.

10. The method according to claim 1, wherein said forming (i) is performed by forming a plurality of sealing portions so as to surround the electronic element in nested form.

11. The method according to claim 1, wherein said pressing (iii) is performed in a vacuum atmosphere or an inert gas atmosphere.

12. A method for sealing an electronic element by bonding a second substrate to a first substrate having the electronic element formed on a surface, and a sealing portion containing an organic material formed so as to surround the electronic element at a greater thickness than the electronic element, the method for sealing an electronic element comprising:

forming a first inorganic material layer on at least an exposed surface of the sealing portion; and pressing together the sealing portion on the first substrate and a bonding part of the second substrate to bond the first substrate and the second substrate.

13. A bonded substrate sealing an electronic element, the bonded substrate comprising:

a first substrate comprising the electronic element on a surface;

a sealing portion formed to surround the electronic element at a thickness greater than the electronic element on the surface of the first substrate;

an inorganic material layer formed on a surface of the sealing portion; and a second substrate bonded to the first substrate with the electronic element and the sealing portion in between.

14. The bonded substrate according to claim 13, further comprising:

an inorganic material layer formed on at least a bonding part of the second substrate corresponding to the sealing portion of the first substrate.

15. The bonded substrate according to claim 13, wherein the inorganic material layer is formed with an inorganic material selected from the group consisting of a metal, a semiconductor, a nitride, a nitroxide, an oxide, and a carbide as a main component.

16. The bonded substrate according to claim 13, wherein the inorganic material layer further comprises a single layer or multiple layers consisting of an inorganic material or an organic material.

17. The bonded substrate according to claim 13, wherein the sealing portion comprises a plurality of sealing portions formed so as to surround the electronic element in nested form.

* * * * *